United States Patent [19]

Elsaesser et al.

[11] Patent Number: 5,068,163
[45] Date of Patent: Nov. 26, 1991

[54] RADIATION-SENSITIVE POSITIVE WORKING COMPOSITION AND COPYING MATERIAL

[75] Inventors: Andreas Elsaesser, Idstein; Werner Frass, Wiesbaden; Dieter Mohr, Budenheim, all of Fed. Rep. of Germany

[73] Assignee: Hoechst Aktiengesellschaft, Frankfurt am Main, Fed. Rep. of Germany

[21] Appl. No.: 362,688

[22] Filed: Jun. 7, 1989

[30] Foreign Application Priority Data

Jun. 18, 1988 [DE] Fed. Rep. of Germany ....... 3820699

[51] Int. Cl.$^5$ .......................... G03C 1/52; G03C 1/492
[52] U.S. Cl. .................................... 430/192; 430/165; 430/270; 430/326
[58] Field of Search .......................... 430/192, 270, 165

[56] References Cited

U.S. PATENT DOCUMENTS

| | | | |
|---|---|---|---|
| 3,433,835 | 3/1969 | Muller et al. | 525/193 |
| 3,515,552 | 6/1970 | Smith | 430/199 |
| 3,779,778 | 12/1973 | Smith et al. | 430/270 |
| 3,869,292 | 3/1975 | Peters | 430/192 |
| 3,902,906 | 9/1975 | Iwama et al. | 430/190 |
| 4,139,384 | 2/1979 | Iwasaki et al. | 430/165 |
| 4,189,323 | 2/1980 | Buhr | 430/281 |
| 4,248,957 | 2/1981 | Sander et al. | 430/270 |
| 4,311,782 | 1/1982 | Buhr et al. | 430/270 |
| 4,439,516 | 3/1984 | Cernigliaro et al. | 430/323 |
| 4,551,409 | 11/1985 | Gulla et al. | 430/192 |
| 4,678,737 | 7/1987 | Schneller et al. | 430/270 |
| 4,699,867 | 10/1987 | Schneller et al. | 430/192 |
| 4,822,719 | 4/1989 | Schneller et al. | 430/270 |
| 4,910,119 | 3/1990 | Schneller et al. | 430/270 |

FOREIGN PATENT DOCUMENTS

| | | |
|---|---|---|
| 0187517 | 7/1986 | European Pat. Off. |
| 0287212 | 10/1988 | European Pat. Off. |
| 739654 | 11/1955 | United Kingdom. |
| 1154749 | 6/1969 | United Kingdom. |
| 1232010 | 5/1971 | United Kingdom. |

OTHER PUBLICATIONS

English language abstract of Japan 76/36,129, 3/1976.

Primary Examiner—Richard L. Schilling
Assistant Examiner—Christopher G. Young
Attorney, Agent, or Firm—Foley & Lardner

[57] ABSTRACT

The invention relates to a positive-working radiation-sensitive mixture and a copying material produced therefrom on a layer support. The mixture contains as essential constituents a 1,2-quinone diazide or a combination of:

1) a compound forming strong acid when exposed to actinic radiation and
2) a compound containing at least one acid-cleavable C—O—C bond, and a binder with repeating units of the general formula I

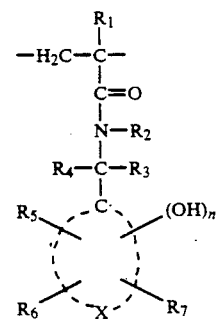

wherein
- $R_1$ denotes a hydrogen or halogen atom, or a cyanide or an alkyl group,
- $R_2$, $R_3$, $R_4$ are identical or different and denote hydrogen, or alkyl or aryl groups,
- $R_5$, $R_6$ and optionally $R_7$ are identical or different and denote hydrogen or halogen atoms, or alkyl, aryl or alkoxy groups, and
- X denotes the atoms necessary to complete a mononuclear or polynuclear carbocyclic aromatic ring system, and
- n is 1, 2 or 3.

The mixture according to the invention yields lithographic printing plates with a high print run which can be thermally post-cured and have good resistance to chemicals, also photoresists with high heat resistance.

17 Claims, No Drawings

RADIATION-SENSITIVE POSITIVE WORKING COMPOSITION AND COPYING MATERIAL

BACKGROUND OF THE INVENTION

The invention relates to a positive-working radiation- or light-sensitive mixture. More particularly, the invention relates to a mixture which comprises:

a) a water-insoluble polymeric binder which is soluble in aqueous alkaline solutions and b) a 1,2-quinone diazide or a combination of
1) a compound forming strong acid when exposed to actinic radiation, and
2) a compound containing at least one acid-cleavable C—O—C bond The invention also relates to a radiation-sensitive copying material comprising a layer support and a radiation-sensitive mixture deposited thereon.

Positive-working light-sensitive mixtures are known and have been described for a wide variety of possible applications such as the production of photoresists or photographic printing plates.

The properties of these copying layers are largely determined by the main component in terms of quantity of the light-sensitive mixture, the binder. As binders for positive copying layers use is almost exclusively made of phenol-formaldehyde or cresolformaldehyde condensation products of the novolak type. For some applications of positive copying layers, however, the properties resulting therefrom are not optimal. This relates, in particular, to the heat resistance in the case of photoresist applications and the level of print runs in the case of use as lithographic printing plates. It has been found that a generally better property profile results from substituting binders with higher glass transition temperature for the novolaks. Thus, a whole series of alkali-soluble binders for positive copying layers have been described, such as, for instance, phenolic resins based on naphthol (U.S. Pat. No. 4,551,409), homo- and copolymers of vinyl phenols (DE-A-2,322,230, corresponding to U.S. Pat. No. 3,869,292 and DE-A-3,406,927, corresponding to U.S. Pat. No. 4,678,737), polymers of the esters of acrylic acids with phenols (Japanese Published Specification 76/36,129, EP-A-0,212,440 and EP-A-0,212,439) or copolymers of hydroxyphenylmaleic acid imides (EP-A-0,187,517).

Binders of the type mentioned have, however, hitherto not been able to find practical application. One reason for this is that these polymers do not satisfactorily fulfill an essential requirement which is imposed on binders of positive copying films: that of the possibility of thermal self-crosslinking. This property, which exists in the case of novolaks, is of importance if the copying layer has to withstand aggressive chemicals. In this respect it is also known to incorporate units in the polymers which, although they are not alkali-soluble, facilitate the thermal crosslinking (EP-A-0,184,044). As a result of this, however, other properties such as the development behavior and the storage stability of the mixture are impaired.

SUMMARY OF THE INVENTION

Accordingly, it is an object of the present invention to provide a positive-working radiationsensitive mixture with which lithographic printing plates with higher print-run performance or photoresists with improved heat resistance can be provided and which can be thermally crosslinked without impairing the storage behavior.

In accomplishing the foregoing objectives, there has been provided, in accordance with one aspect of the present invention, a positive-working radiation-sensitive mixture as described above, which contains as binder a polymer comprising units of the general formula I

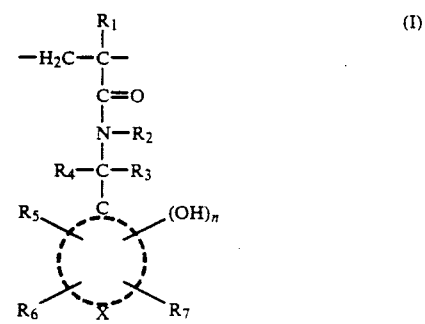

where
$R_1$ denotes a hydrogen or halogen atom, or a cyanide or an alkyl group,
$R_2$, $R_3$, $R_4$ are identical or different and denote hydrogen, or alkyl or aryl groups,
$R_5$, $R_6$ and optionally $R_7$ are identical or different and denote hydrogen or halogen atoms, or alkyl, aryl or alkoxy groups,
X denotes the atoms necessary to complete a mononuclear or polynuclear carbocyclic aromatic ring system, and
n is 1, 2 or 3.

In accordance with another aspect of the present invention, there is provided a radiationsensitive copying material comprising a layer support and a radiation-sensitive copying layer which comprises the above-described mixture.

Other objects, features and advantages of the present invention will become apparent to those skilled in the art from the following detailed description. It should be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

DETAILED DESCRIPTION OF PREFERRED EMBODIMENTS

The invention achieves the result that it is now possible to provide radiation-sensitive mixtures and copying materials which have a good storage capability, with which printing can be carried out in high runs, and which, if used as a photoresist, have an outstanding heat resistance, and which can be thermally post-cured and have a better resistance to chemicals after post-curing compared with the known materials.

In a preferred embodiment, the mixture contains as binder a polymer comprising units of the general formula I, where
$R_l$ denotes a hydrogen or halogen atom, or a cyanide or a $C_1$-$C_6$ alkyl group,
$R_2$, $R_3$, $R_4$ are identical or different and denote hydrogen or $C_1$-$C_6$ alkyl groups, $R_5$, $R_6$ and optionally $R_7$ are identical or different and denote hydrogen or $C_1$–$C_4$ alkyl groups, X denotes the carbon atoms necessary to complete a benzene or naphthalene ring, and n is 1.

Particularly advantageous is a mixture in which $R_1$ denotes hydrogen or a methyl group, $R_2$, $R_3$, $R_4$ denote hydrogen, $R_5$ denotes hydrogen, a $C_1$–$C_4$ alkyl group or a halogen atom, $R_6$ denotes hydrogen, a $C_1$–$C_4$ alkyl group, an aryl group or halogen, $R_7$ denotes hydrogen, X denotes the carbon atoms necessary to complete a benzene or naphthalene ring, and n is 1.

In the event that $R_1$ is an alkyl group the latter contains in general 1 to 6, preferably 1 or 2 carbon atoms. Particularly preferred are compounds in which $R_1$ denotes a hydrogen atom or the methyl group.

Of the substituents $R_2$, $R_3$ and $R_4$, one is advantageously a hydrogen atom, and preferably at least two are hydrogen atoms. If these symbols denote alkyl groups, the latter have, as a rule, 1 to 6, in particular 1 to 3, carbon atoms.

Of the substituents $R_5$, $R_6$ and $R_7$, $R_5$ is advantageously an alkyl group containing 1–4 carbon atoms, preferably a methyl group, and $R_6$ is an alkyl group containing 1–4 carbon atoms or an aryl group. $R_7$ is preferably a hydrogen atom.

The position of the substituents described in the ring system X is not subject to any restrictions but depends only on the preparative accessibility of the compounds.

The carbocyclic aromatic ring system X may be mononuclear or polynuclear. Of the carbocyclic ring systems, mention should be made, in particular, of benzene and naphthalene systems.

Preferred examples of units employed according to the invention are shown in the following structural formulae:

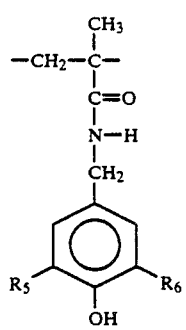

wherein $R_5$ and $R_6$ are identical or different and denote hydrogen, $C_1$–$C_4$ alkyl or halogen; or

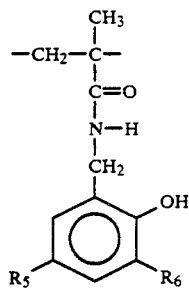

wherein $R_5$ denotes $C_1$–$C_4$ alkyl or halogen and $R_6$ denotes $C_1$–$C_4$ alkyl, halogen or an optionally substituted aryl.

The monomers containing units of the formula I are in general prepared by acid-catalyzed condensation reaction of alkoxymethyl- or hydroxymethylacrylamides with the aromatic ring systems. This process and a multiplicity of synthesis examples are described in Swiss Patent Specification 476,689 and German Patent Specification 1,443,912, corresponding to U.S. Pat. No. 3,433,835, the contents of which are hereby incorporated by reference.

The homopolymerization of the monomers with units of the formula I or copolymerization thereof with other monomers can be carried out by conventional methods, for example in the presence of a polymerization initiator such as azobisisobutyronitrile in organic solvents such as methyl ethyl ketone or ethanol at elevated temperatures for a period of 1 to 20 hours. In addition, however, a suspension, emulsion or bulk polymerization is possible which may also be initiated by radiation, heat or ionic initiators.

The polymers containing units of the formula I may be homopolymers which contain exclusively structural units of the formula I or copolymers of monomers corresponding to the formula I and one or more other vinyl monomers, optionally also containing phenolic groups.

Furthermore, various monomers containing phenol groups of the general formula I may be copolymerized with each other, optionally with further vinyl monomers.

The molecular weight of the homo- or copolymers may be varied within wide limits; preferred are polymers having $M_w$=about 1,000–200,000, particularly those having $M_w$=about 5000–100,000. The hydroxyl number is in general in the range from about 100 to 450, preferably between 200 and 350.

The choice of suitable homo- or copolymers depends in the individual case on the application and on the nature of the other components in the copying film.

Suitable comonomers are reproduced by units of the general formula IV

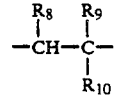

wherein $R_8$ denotes hydrogen or a carboxyl group which may be joined to $R_9$, if the latter is a carboxyl group, to form an acid anhydride or an optionally substituted imide, R$_9$ denotes an alkyl, alkoxy, alkoxycarbonyl, acyl, acyloxy, aryl, aryloxycarbonyl, formyl, cyanide, carboxyl, hydroxyl or aminocarbonyl group, and R$_{10}$ denotes hydrogen, halogen or an alkyl group.

Preferably, consideration is given to units in which

R$_8$ denotes hydrogen,

R$_9$ denotes a C$_1$–C$_4$ alkyl group, a C$_1$–C$_8$ alkoxy group, an alkoxycarbonyl group containing 2–13 carbon atoms, an acyloxy group containing 2–18 carbon atoms, an aryl group containing 6–10 carbon atoms or an aryloxycarbonyl group containing 7–11 carbon atoms, where the aryl groups may be substituted by hydroxyl grouops, and R$_{10}$ denotes hydrogen or a methyl group.

If R$_9$ and R$_{10}$ are alkyl groups, the latter have in general 1–4 carbon atoms. Possible representatives of R$_9$ are: alkoxy groups containing 1–8 carbon atoms, alkoxycarbonyl groups containing 2–13 carbon atoms, acyloxy groups containing 2–18 carbon atoms and aryl groups containing 6–10 carbon atoms. The aminocarbonyl groups may be substituted with 1–8 carbon atoms.

Examples of such compounds are styrene, α-chlorostyrene, α-methylstyrene, 2-, 3- or 4-chloromethylstyrene, 4-bromostyrene, methyl vinyl ether, ethyl vinyl ether, propyl vinyl ether, butyl vinyl ether, acrylonitrile, acrolein, butadiene, acrylic acid, methacrylic acid, the methyl, ethyl, propyl, butyl, pentyl, hexyl, octyl, decyl, dodecyl, 2-ethylhexyl, phenyl, benzyl, biphenyl, naphthyl esters of these acids, methacrylamide, acrylamide, vinyl acetate, vinyl isobutyl ketone and maleic anhydride. Particularly preferred comomomers contain the following units:

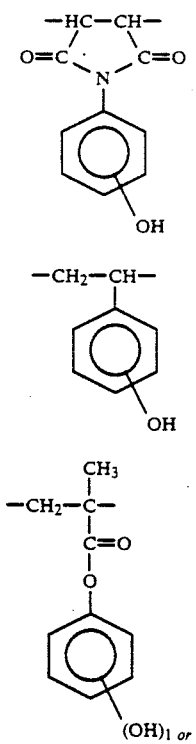

The content of units of the formula I in copolymers depends on the other components of the mixture and on the application. In general, in the mixture according to the invention, polymers having a content of about 10 to 100 mole percent, preferably 15 to 80 mole percent, of optionally different units of the formula I are used.

To prepare the mixtures according to the invention, the binders described are combined with light-sensitive compounds or mixtures whose solubility in an aqueous alkaline developer solution increases with the exposure to light. These include 1,2-quinone diazides and combinations of photolytic acid donors and acid-cleavable compounds.

Preferably, 1,2-naphthoquinone-2-diazide-4- or 5-sulfonic acid esters or amides are used as 1,2-quinone diazides. Of these, the esters, in particular those of the 5-sulfonic acids are preferred. Suitable compounds of this type are known and are described, for example, in German Auslegeschrift 938,233 corresponding to GB Patent Specification 739,654.

The quantity of o-quinonediazide compound is in general about 3 to 50 percent by weight, preferably 7 to 35 percent by weight, based on the nonvolatile components of the mixture.

It is also possible to use the 1,2-quinonediazide compounds in the form of their esters with the polymers according to the invention. The corresponding 1,2-quinonediazide acid chlorides are esterified with the hydroxyl groups of the underlying polymers by processes known in the literature (German Offenlegungsschrift 2,507,548, corresponding to U.S. Pat. No. 4,139,384).

Materials based on acid-cleavable compounds can also be used with good effect in the mixture according to the invention.

The following should primarily be mentioned as acid-cleavable compounds:

a) those containing at least one orthocarboxylic acid ester and/or carboxylic acid amide acetal grouping, in which the compounds may also have a polymeric nature and the said groupings may occur as linking elements in the main chain or as lateral substituents, b) oligomeric or polymeric compounds containing repeating acetal and/or ketal groupings in the main chain and c) compounds containing at least one enol ether or N-acylaminocarbonate grouping.

Acid-cleavable compounds of the type a) as components of radiation-sensitive mixtures are described in detail in EP-A-0,022,571, corresponding to U.S. Pat. No. 4,311,782. Mixtures which contain compounds of the type b) are described in German Patent Specification 2,306,248, corresponding to U.S. Pat. No. 3,779,778, and in German Patent Specification 2,718,259 corresponding to U.S. Pat. No. 4,189,323; compounds of the type c) are described in EP-A-0,006,627, corresponding to U.S. Pat. No. 4,248,957.

Suitable radiation-sensitive components which form strong acids on exposure to light are a large number of known compounds and mixtures, such as phosphonium, sulfonium and iodonium salts, halogen compounds and organometal/organohalogen combinations.

The said phosphonium, sulfonium and iodonium compounds are, as a rule, used in the form of their salts which are soluble in organic solvents, generally as precipitates with complex acids such as tetrafluoroboric acid, hexafluorophosphonic acid, hexafluoroantimonic acid and hexafluoroarsenic acid.

In principle, as halogen-containing, radiation-sensitive compounds which form hydrohalic acid, use may be made of all the organic halogen compounds which are also known as photochemical radical starters, for example those containing at least one halogen atom on a carbon atom or on an aromatic ring (U.S. Pat. No. 3,515,552). Of these compounds, the s-triazine derivatives containing 2-halomethyl groups, in particular trichloromethyl groups, and an aromatic or unsaturated substituent in the triazine nucleus, such as are described in German Patent Specification 2,718,259 corresponding to U.S. Pat. No. 4,189,323, are preferred. Equally well-suited are 2-trichloromethyl-1,3,4-oxdiazoles. The action of these halogen-containing compounds may also be influenced spectrally and increased by known sensitizers.

Examples of suitable photochemical acid donors are: 4-Methyl-6-trichloromethyl-2-pyrone, 4-(3,4,5-trimethoxystyryl)-6-trichloromethyl-2-pyrone, 4-(4-methoxystyryl)-6-(3,3,3-trichloropropenyl)-2-pyrone, 2-trichloromethylbenzimidazole, 2-tribromomethylquinoline, 2,4-dimethyl-1-tribromoacetylbenzene, 3-nitro-1-tribromoacetylbenzene, 4-dibromoacetylbenzoic acid, 1,4-bis(dibromomethyl)benzene, tris(dibromomethyl)-s-triazine, 2-(6-methoxynaphth-2-yl)-, 2-(naphth-1-yl)-, 2-(4-ethoxyethylnaphth-1-yl)-, 2-(benzopyran-3-yl)-, 2-(4-methoxyanthrac-1-yl)-, 2-(4-styrylphenyl)-, and 2-(phenanthr-9-yl)-4,6-bis(trichloromethyl)-s-triazine, and the compounds cited in the examples.

The quantity of the photochemical acid donor may also vary very considerably depending on its chemical nature and the composition of the layer. Favorable results are obtained with about 0.5 to 20 percent by weight, based on the total solids. Preferred are 0.1 to 12 percent by weight. Particularly for light-sensitive layers having thicknesses exceeding 0.01 mm, it is advisable to use relatively little acid donor.

Additionally, numerous other oligomers and polymers may also be used at the same time, for example, phenolic resins of the novolak type or vinyl polymers such as polyvinyl acetals, polymethacrylates, polyacrylates, polyvinyl ethers and polyvinylpyrrolidones, which may themselves be modified by comonomers.

The most favorable proportion of these additives depends on the application-engineering requirements and the effect on the development conditions and is, in general, not more than 20% by weight of the polymer used according to the invention. For special requirements such as flexibility, adhesion, gloss, etc., the radiation-sensitive film may, in addition, also contain substances such as polyglycols, cellulose-ethers, for example ethylcellulose, wetting agents and finely divided pigments in small quantities.

Furthermore, soluble or finely divided dispersible dyestuffs and also, depending on the purpose of application, UV absorbers may also be added to the radiation-sensitive mixture. The triphenylmethane dyestuffs, in particular in the form of their carbinol bases, have proved particularly expedient as dyestuffs. The most favorable quantity ratios of the components can easily be determined in the individual case by preliminary experiments.

In preparing radiation-sensitive copying materials comprising mixtures of the present invention, the mixtures are, in general, dissolved in a solvent to coat a suitable layersupport. The choice of the solvents should be matched to the coating method envisaged, the layer thickness and the drying conditions. Suitable solvents for the mixture according to the invention are ketones such as methyl ethyl ketone, chlorinated hydrocarbons such as trichloroethylene and 1,1,1-trichloroethane, alcohols such as n-propanol, ethers such as tetrahydrofuran, alcohol ethers such as ethylene glycol monoethyl ether, propylene glycol monomethyl ether and esters such as butyl acetate. Mixtures may also be used and these may contain, in addition, also solvents for specific purposes, such as acetonitrile, dioxan or dimethylformamide. In principle, all solvents may be used which do not react irreversibly with the film components. Partial ethers of glycols, in particular ethylene glycol monomethyl ether and propylene glycol monomethyl ether alone or as a mixture are particularly preferred.

As layer support for layerthicknesses below about 10 $\mu$m, metals are generally used. For offset printing plates, the following may be used: millfinished, mechanically and/or electrochemically grained and optionally anodized aluminum which may, in addition, also be pretreated chemically, for example with polyvinylphosphonic acid, silicates, phosphates, hexafluorozirconates or with hydrolyzed tetraethyl orthosilicate.

The layer supportis coated in a known manner by spin-coating, spraying, immersing, by roller application, using slit nozzles, doctor-blading or curtain application.

For exposure to light, use may be made of the standard light sources such as fluorescent lamps, pulsed xenon lamps, metal-halide doped mercury-vapor high-pressure lamps and carbon-arc lamps.

In this description, exposure to light or irradiation is to be understood as exposure to actinic electromagnetic radiation in wavelength ranges below about 500 nm. All radiation sources emitting in this wavelength range are, in principle, suitable.

Advantageously, use may also be made of laser irradiation apparatuses, in particular automatic processing units which contain an argon-ion or krypton-ion laser as radiation source.

The irradiation may also be carried out with electron beams. In this case, acid-forming compounds which are not light-sensitive in the normal sense may be used as initiators of the solubilization reaction, for example halogenated aromatic compounds or halogenated polymeric hydrocarbons. X-rays may also be used for image generation.

The layer exposed to light or irradiated in accordance with an image may be removed in a known manner with virtually the same developers as are known for commercial naphthoquinone diazide layers and copying resists, or the novel materials may advantageously be matched in their copying behavior to the known aids such as developers and programmed spray-development apparatuses. The aqueous developer solutions may, for example, contain alkali-phosphates, silicates or hydroxides and furthermore, wetting agents and also, optionally, relatively small proportions of organic solvents. In particular cases, solvent/water mixtures may be used as developers. The choice of the most favorable developer may be determined by experiments with the layer used in a particular case. If required, the development may be promoted mechanically.

If used as printing plates, the developed plates may be heated for a short time to elevated temperatures, as is known for diazo films from GB Patent Specification 1,154,749, to increase the mechanical strength during printing and also the resistance to wash-off agents, deletion agents and printing inks which can be cured with UV light.

Examples of preferred embodiments are specified below. In the examples, parts by weight (pbw) and parts by volume (pbv) are in the ratio of g to $cm^3$. Unless otherwise specified, percentage and quantity ratios are to be understood as being in weight units.

Sunthesis Example 1 of the Preparation of the Monomers 129 g (1 mol) of N-methoxymethylmethacrylamide
122 g (1 mol) of 2,6-dimethylphenol
0.1 g (0.5 mmol) of thiodiphenylamine and
1 g (0.01 mol) of sulfuric acid are dissolved in 114 g of ethanol and heated under reflux for 5 hours. After cooling the reaction solution to 10° C., the product crystallizes out, is filtered off and dried at 50° C. in vacuo. This results in 178 g (81%) of 3,5-dimethyl-4-hydroxythacrylamide, m.p. 135°–136° C.

Table 1 shows a number of preferred monomers which are accessible in accordance with this instruction. Further examples may be found in Swiss Patent Specification 476,689 and in German Patent Specification 1,443,912, corresponding to U.S. Pat. No. 3,433,835.

TABLE 1

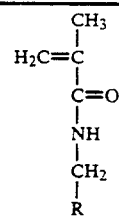

| Monomer No. | R | Yield (%) | M.p. (°C.) |
|---|---|---|---|
| 1 | 4-hydroxy-3,5-dimethylphenyl | 81 | 135–136 |
| 2 | 2-hydroxy-3,5-dimethylphenyl | 75 | 109–110 |
| 3 | 4-hydroxy-3,5-diethylphenyl | 71 | 117–118 |
| 4 | 2-hydroxynaphthyl | 48 | 151–152 |

Synthesis Example 2 of the Preparation of the Polymers 1 mol of the monomer or monomer mixture (cf. Table 2) and
0.015 mol of azobisisobutyronitrile are combined in ethanol or butanone or tetrahydrofuran to produce a starting solution having a solids content of 40% and are polymerized for 17 hours at 70° C. with inert conditions provided by nitrogen. The mixture is then added to 25 times the volume of water while stirring vigorously. The precipitated polymer is dried at 50° C. in vacuo for 48 hours. Table 2 summarizes the polymers prepared in this manner.

TABLE 2

| Polymer No. | Monomer No. (mol %) | Comonomer 1 (mol %) | | Comonomer 2 (mol %) | | Reduced viscosity dl/g |
|---|---|---|---|---|---|---|
| 1 | 1 | 100 | — | — | | 0.176 |
| 2 | 2 | 100 | — | — | | 0.188 |
| 3 | 3 | 100 | — | — | | 0.173 |
| 4 | 4 | 100 | — | — | | 0.191 |
| 5 | 1 | 65 | Styrene | 10 | Methyl methacrylate 25 | 0.133 |
| 6 | 2 | 65 | Styrene | 10 | Methyl methacrylate 25 | 0.124 |
| 7 | 1 | 25 | 2-Hydroxyphenyl methacrylate | 46 | Styrene 29 | 0.197 |
| 8 | 1 | 20 | 2-Hydroxyphenyl methacrylate | 51 | Styrene 29 | 0.209 |
| 9 | 1 | 15 | 2-Hydroxyphenyl methacrylate | 56 | Styrene 29 | 0.199 |
| 10 (Comparison) | — | — | 2-Hydroxyphenyl methacrylate | 100 | — | 0.211 |

Polymer 10 corresponds to a substance known from EP-A-0,212,440.

Synthesis Example 3 of the Preparation of a Polymer Containing Hydroxyphenylmaleimide Units 1 mol of the monomer mixture (in which hydroxyphenylmaleimide is used in the acetylated form) and 0.015 mol of axobisisobutyronitrile are combined in butanone or tetrahydrofuran to form a starting mixture having a solids content of 35% and polymerized as in synthesis Example 2. Then the five-fold molar quantity of methanol (based on acetylated hydroxyphenylmaleimide) and a catalytic quantity of sulfuric acid are added and the methyl acetate formed is slowly distilled off together with the excess of methanol. The polymer is isolated by precipitating the polymer in methanol/water (1:1). The polymers synthesized by this method are cited in Table 3 (no. 17 and 18).

Synthesis Example 4 of the Preparation of a Polymer Containing Hydroxystyrene as Comonomer 1 mol of the monomer mixture (in which hydroxystyrene is used in the acetylated form) and
0.015 mol of azobisisobutyronitrile
are combined in ethanol to produce a starting solution having a solids content of 40% and polymerized as in synthesis Example 2. NaOH (15 mol% based on acetoxystyrene), 10% strength in methanol, is then added and hydrolysis is carried out for 5 hours at 60° C. HCl (15 mol%, based on acetoxystyrene) is then added as a 37% strength aqueous solution and the mixture is allowed to cool while stirring. The polymer is isolated as described in synthesis Example 2. The polymers 11–16 cited in Table 3 were prepared by this method.

Synthesis Example 5 of the Preparation of a Polymer Containing Lateral 1,2-Quinonediazide Units 21.9 g of Polymer No. 1 and
5.37 g (0.02 mol) of 1,2-naphthoquinone-2-diazide-5-sulfonylchloride
are dissolved in 250 ml of tetrahydrofuran and, while stirring and cooling, 2 g (0.02) of triethylamine in 10 of tetrahydrofuran are added dropwise in a manner such that the temperature does not exceed 25° C. Stirring is continued for a further 2 hours at room temperature and precipitation is then carried out in 3 liters of 4% strength hydrochloric acid. The product is filtered off and dried at room temperature in a vacuum drying oven to constant weight. A conversion of 97.1% is calculated from the sulfur content of the polymer.

If the reaction is repeated with 1,2-naphthoquinone-2-diazide-4-sulfonyl chloride, a polymer results having a content of 1,2-quinonediazide units of 93.7% of theory.

TABLE 3

| Polymer No. | Monomer No. | (mol %) | Comonomer 1 | (mol %) | Comonomer 2 | (mol %) | Reduced viscosity $\frac{dl}{g}$ |
|---|---|---|---|---|---|---|---|
| 11 | 1 | 15 | 4-Hydroxystyrene | 40 | Styrene | 45 | 0.198 |
| 12 | 2 | 15 | 4-Hydroxystyrene | 40 | Styrene | 45 | 0.203 |
| 13 | 3 | 15 | 4-Hydroxystyrene | 40 | Styrene | 45 | 0.201 |
| 14 | 4 | 15 | 4-Hydroxystyrene | 42 | Styrene | 43 | 0.227 |
| 15 | 1 | 15 | 4-Hydroxystyrene | 35 | Methyl methacrylate | 50 | 0.385 |
| 16 (Comparison) | — | — | 4-Hydroxystyrene | 100 | — | — | 0.205 |
| 17 | 1 | 15 | 4-Hydroxyphenylmaleimide | 40 | Styrene | 45 | 0.591 |
| 18 (Comparison) | — | — | 4-Hydroxyphenylmaleimide | 50 | Styrene | 50 | 0.721 |

Polymer 16 corresponds to a substance known from German Offenlegungsschrift 3,406,927 and polymer 18 to a substance known from EP-A-0,187,517.

Polymer 16 corresponds to a substance known from German Offenlegungsschrift 3,406,927 and polymer to a substance known from EP-A-0,187,517.

EXAMPLE 1

An aluminum plate which was grained electrolytically in hydrochloric acid, anodized in sulfuric acid and hydrophilized with polyvinylphosphonic acid is spin-coated with the following solution:

7 pbw (parts by weight) of binder (cf. Table 4),
1.5 pbw of an esterification product of 3 mol of 1,2-naphthoquinone-(2)-diazide-4-sulfonyl chloride and 1 mol of 2,3,4-trihydroxy-benzophenone,
0.2 pbw of 1,2-naphthoquinone-(2)-diazide-4-sulfonyl chloride,
0.08 pbw of Victoria pure blue (C.I. 44 045),
100 pbw of a solvent mixture composed of tetrahydrofuran and propylene glycol monmethyl ether (55:45)

Drying for 2 minutes at 100° C. results in a film thickness of 2 mm.

The printing plates are exposed to light under a 5 kW metal halide lamp at a distance of 110 cm through a continuous tone step wedge with 13 density steps of 0.15 each (exposure wedge "BK 01" manufactured by Hoechst AG) such that after development during sixty seconds (s) in one of the following developers a clear step 3 is obtained:

Developer A:
8.5 pbw of $Na_2SiO_3 \cdot 9\ H_2O$,
0.8 pbw of NaOH and
1.5 pbw of $Na_2B_4O_7 \cdot 10\ H_2O$ in
89.2 pbw of $H_2O$.

Developer B:
5.3 pbw of sodium metasilicate nonahydrate
3.4 pbw of trisodium phosphate dodecahydrate,
0.3 pbw of sodium hydrogenphosphate (anhydrous),
91.0 pbw of water.

Then the plates are wiped over with a commercial baking gum (for example RC 99) produced by Hoechst AG and baked for 5 minutes at 230° C. in a resist drying oven. The resistance of the baked plates to chemicals is tested with dimethylformamide.

TABLE 4

| Example No. | Polymer No. | Exposure time(s) | Developer | Resistance to chemicals after baking |
|---|---|---|---|---|
| 1-1 | 1 | 65 | B | + |
| 1-2 | 2 | 65 | B | + |
| 1-3 | 3 | 65 | B | + |
| 1-4 | 4 | 68 | A | + |
| 1-5 | 5 | 62 | A | + |
| 1-6 | 6 | 62 | A | + |
| 1-7 | 7 | 60 | A | + |
| 1-8 | 8 | 60 | A | + |
| 1-9 | 9 | 60 | A | + |
| 1-10 | 10 (comparison) | 60 | B | − |
| 1-11 | 11 | 58 | A | + |
| 1-12 | 12 | 58 | A | + |
| 1-13 | 13 | 58 | A | + |
| 1-14 | 14 | 60 | A | + |
| 1-15 | 15 | 56 | A | + |
| 1-16 | 16 (comparison) | 55 | B | − |
| 1-17 | 17 | 62 | B | + |
| 1-18 | 18 (comparison) | 58 | B | − |
| 1-19 | m-cresol-formaldehyde novolak (comparison) | 62 | A | + |

Printing tests were carried out in a sheet-fed offset printing machine with a series of these plates in the non-thermally cured state. Table 5 reflects the results.

TABLE 5

| Example No. | Polymer | Print Run | Glass transition temperatures of the polymers |
|---|---|---|---|
| 1-5 | 5 | 150,000 | 136° C. |
| 1-7 | 7 | 160,000 | 134° C. |
| 1-10 (comparison) | 10 | 160,000 | 132° C. |
| 1-16 (comparison) | 16 | 140,000 | 154° C. |
| 1-18 (comparison) | 18 | 130,000 | 238° C. |
| 1-19 (comparison) | m-cresol-formaldehyde novolak | 90,000 | 84° C. |

The results show that the polymeric printing-plate copying layers according to the invention yield a higher print run than conventional positive copying layers containing novolaks as binders and that they become resistant to aggressive chemicals as a result of thermal post-curing.

EXAMPLE 2

To produce a positive dry resist, coating solutions are prepared from:
40 pbw of binder,
10 pbw of a compound containing acid-cleavable C—O—C units,
0.5 pbw of photochemical acid former,
6.0 pbw of polyethyl acrylate,
0.01 pbw of crystal violet base (C.I. 42 555:1),
100 pbw of butanone.

These solutions are each spun onto 26 μm-thick, biaxially oriented and heat-set polyethylene terephthalate sheets and then post-dried for 10 minutes at 100° C. in a circulating-air drying oven. The rotary speed of the spinner is regulated so that a film thickness of approx. 25 μm results. As a protection against dust and scratches, a polyethylene sheet is furthermore cladded onto it as a covering sheet.

To produce circuit boards, after peeling off the covering sheet, the dry resists are laminated in a commercially available laminator onto a clean preheated support which is composed of an insulating material with single-sided or double-sided, 35 μm-thick copper cladding. After peeling off the base sheet and optional postdrying, exposure to light is carried out under a mask with a 5 kW metal-halide lamp at a distance of 110 cm and development is carried out after a waiting time of 15 minutes in 1% strength sodium hydroxide for 90 seconds.

The resist stencils produced in this manner have an outstanding plating resistance, in particular in the buildup of copper and Pb/Sn alloys by plating.

Boards treated in this manner may subsequently be reexposed to light and developed. With this procedure, solder pads of Pb/Sn can be plated on at the drilled holes in a first step, and in a second exposure and development step, the conductor track pattern can then be transferred to the still existing resist layer. After etching the copper which has been laid bare with ammoniacal Cu(II) chloride solution, a circuit board is obtained by copper technology, i.e., the Pb/Sn alloy is only built up at places where it is required in the subsequent soldering process.

The results are shown in Table 6. The following compounds with acid-cleavable C—O—C units were used:
No. 1: polymeric orthoester prepared by condensation of trimethylorthoformate with 4-oxa-6,6-bis(-hydroxymethyl)octan-1-ol,
No. 2: polyacetal prepared from triethyl glycol and 2-ethylbutyraldehyde.

The following photochemical acid formers were used:
No. 1: 2-(4-ethoxynaphth-1-yl)-4,6-bis(trichloromethyl)s-triazine,
No.2: 2-(4-styrylphenyl)-4,6-bis(trichloromethyl)-s-triazine.

TABLE 6

| Example No. | Polymer No. | Acid-cleavable compound No. | Photochemical acid former No. | Exposure time(s) |
|---|---|---|---|---|
| 2-1 | 5 | 1 | 1 | 25 |
| 2-2 | 5 | 1 | 2 | 23 |
| 2-3 | 5 | 2 | 1 | 27 |
| 2-4 | 5 | 2 | 2 | 25 |
| 2-5 | 7 | 2 | 2 | 23 |
| 2-6 | 11 | 2 | 2 | 21 |
| 2-7 | 15 | 2 | 2 | 20 |

EXAMPLE 3

To prepare high-resolution positive liquid resists, the following coating solutions are prepared:
26 pbw of binder (cf. Table 7),
4 pbw of an esterification product of 3 mol of 1,2-naphthoquinone-(2)-diazide-4-sulfonyl chloride and mol of 2,3,4-trihydroxybenzophenone,
80 pbw of propylene glycol monomethyl ether acetate.

After filtration through a filter having a pore diameter of 0.2 μm (Millipore), the photoresist solutions are spun onto commercial silicon wafers, polished as usual and provided with an 0.2 μm-thick $SiO_2$ film by oxidation. With a rotary speed of 8,000/min, layer thicknesses of between 0.9 and 1.1 μm are obtained.

The wafers so coated are dried for 30 minutes at 90° C. After cooling and conditioning to a precisely defined room climate of 23° C. and 40 to 50% relative humidity, the wafers are exposed to light in a contact exposure apparatus with an intensity of 4.5 mW/cm² at 365 nm under a commercially available chromium mask and developed for 60 seconds in a 2.86%-strength tetramethylammonium hydroxide solution. In all cases it is possible to reproduce 1 μm wide lines and spaces.

After a heat treatment of 30 minutes at 150° C., the edges of the structures are assessed. The results are presented in Table 7.

TABLE 7

| Example No. | Polymer No. | Exposure time(s) | Edge structure after heat treatment |
|---|---|---|---|
| 3-1 | 4 | 25 | almost unaltered |
| 3-2 | 5 | 20 | slight roundings |
| 3-3 | 7 | 20 | slight roundings |
| 3-4 | 14 | 20 | slight roundings |
| 3-5 | 17 | 20 | almost unaltered |
| 3-6 | m-cresol formaldehyde novolak (comparison) | | severe roundings |

What is claimed is:

1. A positive-working radiation-sensitive mixture which comprises
   a) a water-insoluble polymeric binder which is soluble in aqueous alkaline solution, in an amount sufficient to form a solid layer, and
   b) a radiation-sensitive compound or combination of compounds selected from the group consisting of a 1,2-quinone diazide and a combination of
      1) a compound forming strong acid when exposed to actinic radiation and
      2) a compound containing at least one cleavable C—O—C bond, in an amount sufficient to increase the solubility of said solid layer on exposure to actinic radiation, wherein said binder is a polymer comprising units of the general formula I

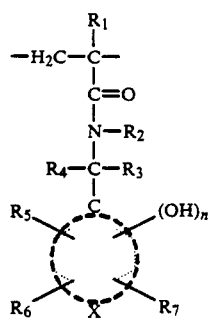

where
$R_1$ denotes a hydrogen or halogen atom, or a cyanide or an alkyl group,
$R_2$, $R_3$, $R_4$ are identical or different and denote hydrogen, or alkyl or aryl groups,
$R_5$, $R_6$ and optionally $R_7$ are identical or different and enote hydrogen or halogen atoms, or alkyl, aryl or alkoxy groups,
X denotes the atoms necessary to complete a mononuclear or polynuclear carbocyclic aromatic ring system, and
n is 1, 2 or 3.

2. A mixture as claimed in claim 1, wherein $R_1$ denots a hydrogen or halogen atom, or a cyanide or a $C_1$-$C_6$ alkyl group,
$R_2$, $R_3$, $R_4$ are identical or different and denote hydrogen or $C_1$-$C_6$ alkyl groups,
$R_5$, $R_6$ and optionally $R_7$ are identical or different and denote hydrogen or $C_1$-$C_4$ alkyl groups,
X denotes the carbon atoms necessary to complete a benzene or naphthalene ring, and
n is 1.

3. A mixture as claimed in claim 1, wherein
$R_1$ denotes hydrogen or a methyl group,
$R_2$, $R_3$, $R_4$ denote hydrogen,
$R_5$ denotes hydrogen, a $C_1$-$C_4$ alkyl group or a halogen atom,
$R_6$ denotes hydrogen, a $C_1$-$C_4$ alkyl group, an aryl group or halogen,
$R_7$ denotes hydrogen, and
X denotes the carbon atoms necessary to complete a benzene or naphthalene ring, and
n is 1.

4. A mixture as claimed in claim 1, wherein
$R_1$ is a $C_1$-$C_6$ alkyl group.

5. A mixture as claimed in claim 4, wherein $R_1$ is a methyl or ethyl group.

6. A mixture as claimed in claim 1, wherein at least one of $R_2$, $R_3$ and $R_4$ is a hydrogen atom.

7. A mixture as claimed in claim 6, wherein at least two of $R_2$, $R_3$ and $R_4$ are hydrogen atoms.

8. A mixture as claimed in claim 1, wherein $R_5$ is a $C_1$-$C_4$ alkyl group.

9. A mixture as claimed in claim 1, wherein $R_6$ is a $C_1$-$C_4$ alkyl group or an aryl group.

10. A mixture as claimed in claim 1, wherein $R^7$ is a hydrogen atom.

11. A mixture as claimed in claim 1 which comprises as binder a polymer comprising units of the general formula II

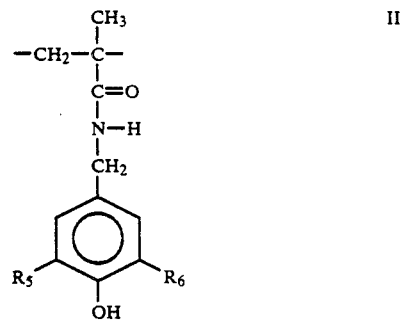

wherein
R5 and R6 are identical or different and denote hydrogen, $C_1$-$C_4$ alkyl or halogen.

12. A mixture as claimed in claim 1 which comprises as binder a polymer comprising units of the general formula III

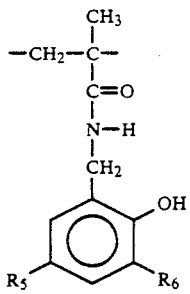

wherein

R₅ denotes $C_1$-$C_4$ alkyl or halogen and

R₆ denotes $C_1$-$C_4$ alkyl, halogen or an optionally substituted aryl.

13. A mixture as claimed in claim 1, wherein the polymeric binder furthermore comprises at least one repeating unit of the general formula IV $$-\overset{R_8}{\underset{}{C}}H-\overset{R_9}{\underset{R_{10}}{C}}-$$  IV wherein R₈ denotes hydrogen or a carboxyl group which may be joined to R₉, if the latter is a carboxyl group, to form an acid anhydride or an optionally substituted imide, R₉ denotes an alkyl, alkoxy, alkoxycarbonyl, acyl, acyloxy, aryl, aryloxycarbonyl, formyl, cyanide, carboxyl, hydroxyl or amino carbonyl group, and R₁₀ denotes hydrogen, halogen or an alkyl group.

14. The mixture as claimed in claim 13, wherein, R₈ denotes hydrogen,

R₉ denotes a $C_1$-$C_4$ alkyl group, a $C_1$-$C_8$ alkoxy group, an alkoxy carbonyl group containing 2-13 carbon atoms, an acyloxy group containing 2-18 carbon atoms, an aryl group containing 6-10 carbon atoms or an aryloxycarbonyl group containing 7-11 carbon atoms, where the aryl groups may be substituted by hydroxyl groups, and R₁₀ denotes hydrogen or a methyl group.

15. A mixture as claimed in claim 13, wherein the formula IV stands for one of the following units:

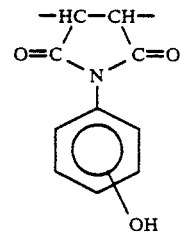

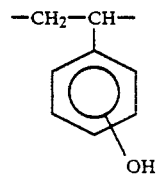

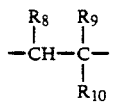

$(OH)_{1 \text{ or } 2}$

16. A mixture as claimed in claim 1, wherein the molecular weight of the polymer is about 1000 to 200,000 and the hydroxyl number is about 100 to 450.

17. A radiation-sensitive copying material comprising a layer support and a radiation-sensitive copying layer with comprises a mixture as claimed in claim 1.

* * * * *